US012605748B2

(12) United States Patent
Sim et al.

(10) Patent No.: US 12,605,748 B2
(45) Date of Patent: Apr. 21, 2026

(54) LIQUID CHEMICAL TANK MODULE AND LIQUID CHEMICAL SUPPLY APPARATUS INCLUDING THE SAME

(71) Applicant: SEMES CO., LTD., Cheonan-si (KR)

(72) Inventors: Byungwoo Sim, Yongin-si (KR); Bok Kyu Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 298 days.

(21) Appl. No.: 18/239,503

(22) Filed: Aug. 29, 2023

(65) Prior Publication Data

US 2024/0091822 A1      Mar. 21, 2024

(30) Foreign Application Priority Data

Sep. 16, 2022      (KR) ......................... 10-2022-0117039

(51) Int. Cl.
B08B 3/10 (2006.01)
B08B 3/02 (2006.01)
(Continued)

(52) U.S. Cl.
CPC ................ B08B 3/10 (2013.01); B08B 3/022 (2013.01); B08B 3/08 (2013.01); B08B 13/00 (2013.01);
(Continued)

(58) Field of Classification Search
CPC .. B08B 3/10; B08B 3/022; B08B 3/08; B08B 13/00; B08B 2203/002; H01L 21/67051; H01L 21/67253
See application file for complete search history.

(56) References Cited

U.S. PATENT DOCUMENTS

2013/0340678 A1* 12/2013 Wamura ................. C23C 14/26
                                                                    118/712
2014/0182455 A1*  7/2014 Mizota ............... B01D 19/0005
                                                                     96/202
(Continued)

FOREIGN PATENT DOCUMENTS

JP        2018-101677 B      4/2021
KR   10-2006-0033233 A      4/2006
(Continued)

OTHER PUBLICATIONS

KR20090048101 translation (Year: 2009).*

*Primary Examiner* — Michael E Barr
*Assistant Examiner* — Lauren G Orta
(74) *Attorney, Agent, or Firm* — Muir Patent Law, PLLC

(57) ABSTRACT

Provided are a liquid chemical tank module and a liquid chemical supply apparatus, the liquid chemical tank module including a tank body having a storage space capable of storing a liquid chemical, a gas ejector for ejecting an inert gas into the liquid chemical to reduce dissolved oxygen in the liquid chemical of the tank body, and a controller for applying a control signal to the gas ejector to control a flow rate of the inert gas, wherein the gas ejector includes a gas pipe extending into the storage space and at least partially dipped in the liquid chemical to supply the inert gas from outside of the tank body into the storage space, and a plurality of ejection nozzles along the extension direction of the gas pipe to eject the inert gas into the storage space or the liquid chemical in the storage space.

16 Claims, 10 Drawing Sheets

(51) Int. Cl.
| | | |
|---|---|---|
| *B08B 3/08* | (2006.01) | |
| *B08B 13/00* | (2006.01) | |
| *H10P 72/00* | (2026.01) | |

(52) U.S. Cl.
CPC .... *B08B 2203/002* (2013.01); *H10P 72/0414* (2026.01); *H10P 72/0604* (2026.01)

(56) References Cited

U.S. PATENT DOCUMENTS

| | | | |
|---|---|---|---|
| 2018/0169712 A1 | 6/2018 | Yasuda et al. | |
| 2019/0039101 A1* | 2/2019 | Bourdat | H01L 21/67051 |
| 2021/0197237 A1* | 7/2021 | Yun | B08B 3/08 |
| 2022/0259551 A1* | 8/2022 | Noble | C12M 41/26 |

FOREIGN PATENT DOCUMENTS

| | | | | |
|---|---|---|---|---|
| KR | 20090048101 A * | 5/2009 | ....... | H01L 21/67051 |
| KR | 10-2019-0095887 | 8/2019 | | |
| KR | 10-2062607 B1 | 1/2020 | | |
| KR | 10-2142211 B1 | 8/2020 | | |

* cited by examiner

LIQUID CHEMICAL TANK MODULE AND LIQUID CHEMICAL SUPPLY APPARATUS INCLUDING THE SAME

CROSS-REFERENCE TO RELATED PATENT APPLICATION

This application claims the benefit of Korean Patent Application No. 10-2022-0117039, filed on Sep. 16, 2022, in the Korean Intellectual Property Office, the disclosure of which is incorporated herein in its entirety by reference.

BACKGROUND OF THE INVENTION

1. Field of the Invention

The present invention relates to a liquid chemical tank module and a liquid chemical supply apparatus including the same and, more particularly, to a liquid chemical tank module capable of supplying a liquid chemical used to process a substrate to a substrate processing apparatus, and a liquid chemical supply apparatus including the same.

2. Description of the Related Art

Various processes such as photolithography, etching, ashing, and deposition are performed to manufacture semiconductor devices or liquid crystal displays. In these processes, due to the requirement of miniaturization of circuit patterns on a substrate, device characteristics and a production yield are more sensitive to particles and contaminants. As such, a cleaning process for removing the particles and the contaminants is performed before or after each process. A plurality of chemical, rinsing, and drying processes may be sequentially performed as the cleaning process in a chamber, and contaminants or particles and fumes, which are produced in the cleaning process, may be exhausted to the outside by inducing the downflow of clean air in the chamber during the cleaning process.

In the cleaning process of the substrate, various types of liquid chemicals may be used to remove the contaminants on the substrate, and a liquid chemical may be sprayed onto the substrate through a spray nozzle positioned above the substrate. The liquid chemical to be sprayed through the spray nozzle for the cleaning process of the substrate may be controlled to a target temperature suitable for process conditions by a liquid chemical supply apparatus including a liquid chemical tank module, and then supplied to the spray nozzle of the substrate processing apparatus.

However, according to the above-described liquid chemical tank module and the liquid chemical supply apparatus including the same, during the cleaning process of the substrate, oxygen inside the liquid chemical tank module may be gradually increased and thus dissolved oxygen in the liquid chemical remaining inside may also be gradually increased. As such, an advanced deposition material (ADM) etch rate (ER) and a chemical ER may be lowered and thus substrate defects may be caused. For example, when a liquid chemical such as ADM is used, oxygen inside the liquid chemical tank module may be gradually increased and thus $NH_4OH$ may be decomposed in contact with $O_2$ to dilute the liquid chemical, thereby lowering an ADM ER and causing problems in mass-produced substrates (or wafers).

SUMMARY OF THE INVENTION

The present invention provides a liquid chemical tank module capable of reducing dissolved oxygen in a liquid chemical remaining inside the liquid chemical tank module by preventing an increase in oxygen inside the liquid chemical tank module during a cleaning process of a substrate, and a liquid chemical supply apparatus including the liquid chemical tank module. However, the above description is merely an example, and the scope of the present invention is not limited thereto.

According to an aspect of the present invention, there is provided a liquid chemical tank module including a tank body having a storage space capable of storing a liquid chemical, a gas ejector for ejecting an inert gas into the liquid chemical stored in the storage space to reduce dissolved oxygen in the liquid chemical stored in the storage space of the tank body, and a controller for applying a control signal to the gas ejector to control a flow rate of the inert gas ejected through the gas ejector, wherein the gas ejector includes a gas pipe extending into the storage space through a surface of the tank body in a height direction of the tank body and at least partially dipped in the liquid chemical stored in the storage space to supply the inert gas from outside of the tank body into the storage space, and a plurality of ejection nozzles provided at predetermined intervals along the extension direction of the gas pipe to eject the inert gas into the storage space or the liquid chemical stored in the storage space.

A plurality of gas ejectors may be mounted in the tank body.

The gas ejectors may include a first gas ejector mounted at one side of the tank body to eject the inert gas into the storage space or the liquid chemical stored in the storage space, and a second gas ejector mounted at other side of the tank body to face the first gas ejector to eject the inert gas into the storage space or the liquid chemical stored in the storage space.

The liquid chemical tank module may further include a sensor for sensing a level of the liquid chemical stored in the storage space of the tank body.

The sensor may include a plurality of level sensors corresponding to the number of the plurality of ejection nozzles, mounted on the gas pipe, and positioned individually adjacent to the plurality of ejection nozzles to sense the liquid chemical.

The plurality of ejection nozzles may include a first ejection nozzle provided on the gas pipe at a predetermined height from a bottom surface of the storage space so as to be positioned at a height adjacent to the bottom surface, and a second ejection nozzle provided above the first ejection nozzle on the gas pipe so as to be spaced apart from the first ejection nozzle by a first interval, and the plurality of level sensors may include a first level sensor mounted above the first ejection nozzle on the gas pipe so as to be adjacent to and spaced apart from the first ejection nozzle by a second interval less than the first interval, and a second level sensor mounted above the second ejection nozzle on the gas pipe so as to be adjacent to and spaced apart from the second ejection nozzle by the second interval.

The plurality of ejection nozzles may further include an nth ejection nozzle provided above an (n−1)th ejection nozzle on the gas pipe so as to be spaced apart from the (n−1)th ejection nozzle by the first interval, and the plurality of level sensors may further include an nth level sensor mounted above the nth ejection nozzle on the gas pipe so as to be adjacent to and spaced apart from the nth ejection nozzle by the second interval.

The plurality of level sensors may be mounted on at least one of the first and second gas ejectors.

The sensor may include a liquid height sensor mounted at an upper side of the tank body to measure the level of the liquid chemical stored in the storage space in a non-contact manner.

The controller may receive level information of the liquid chemical from the sensor and apply a control signal to the gas ejector in such a manner that a flow rate of the inert gas ejected through ejection nozzles dipped in the liquid chemical from among the plurality of ejection nozzles is higher than a flow rate of the inert gas ejected through ejection nozzles not dipped in the liquid chemical.

The controller may feedback-control the flow rate of the inert gas ejected through the ejection nozzles dipped in the liquid chemical based on the level information of the liquid chemical in such a manner that a total flow rate of the inert gas ejected through the ejection nozzles dipped in the liquid chemical is constantly maintained regardless of a change in the number of ejection nozzles dipped in the liquid chemical based on a change in the level of the liquid chemical.

When the number of ejection nozzles dipped in the liquid chemical is increased due to an increase in the level of the liquid chemical, the controller may apply a control signal to the gas ejector to reduce the flow rate of the inert gas ejected through the ejection nozzles dipped in the liquid chemical in such a manner that the total flow rate of the inert gas ejected through the ejection nozzles dipped in the liquid chemical is constantly maintained.

When the number of ejection nozzles dipped in the liquid chemical is reduced due to a reduction in the level of the liquid chemical, the controller may apply a control signal to the gas ejector to increase the flow rate of the inert gas ejected through the ejection nozzles dipped in the liquid chemical in such a manner that the total flow rate of the inert gas ejected through the ejection nozzles dipped in the liquid chemical is constantly maintained.

The controller may apply a control signal to the gas ejector in such a manner that the inert gas is ejected equally at a first flow rate through the ejection nozzles dipped in the liquid chemical and ejected equally at a second flow rate through the ejection nozzles not dipped in the liquid chemical, and that the first flow rate is higher than the second flow rate.

The plurality of ejection nozzles may be provided perpendicularly to the gas pipe based on the extension direction of the gas pipe to eject the inert gas in a direction parallel to a surface of the liquid chemical stored in the storage space of the tank body.

The plurality of ejection nozzles may be tilted upward at a predetermined angle to the gas pipe based on the extension direction of the gas pipe to eject the inert gas diagonally toward a surface of the liquid chemical stored in the storage space of the tank body.

The plurality of ejection nozzles may be tilted upward at the predetermined angle of 40° to 50° to the gas pipe.

According to another aspect of the present invention, there is provided a liquid chemical supply apparatus including a first liquid chemical tank for supplying a liquid chemical to a substrate processing apparatus for processing a substrate, and a second liquid chemical tank connected to the first liquid chemical tank through at least one circulation line to circulate the liquid chemical to the first liquid chemical tank and control the liquid chemical to a target temperature suitable for process conditions, wherein each of the first and second liquid chemical tanks includes a tank body having a storage space capable of storing the liquid chemical, a gas ejector for ejecting an inert gas into the liquid chemical stored in the storage space to reduce dissolved oxygen in the liquid chemical stored in the storage space of the tank body, and a controller for applying a control signal to the gas ejector to control a flow rate of the inert gas ejected through the gas ejector, and wherein the gas ejector includes a gas pipe extending into the storage space through a surface of the tank body in a height direction of the tank body and at least partially dipped in the liquid chemical stored in the storage space to supply the inert gas from outside of the tank body into the storage space, and a plurality of ejection nozzles provided at predetermined intervals along the extension direction of the gas pipe to eject the inert gas into the storage space or the liquid chemical stored in the storage space.

The circulation line may include an inner circulation line for circulating the liquid chemical of the first and second liquid chemical tanks and controlling the liquid chemical to the target temperature while the liquid chemical is being circulated, and an outer circulation line for supplying the liquid chemical stored in the first liquid chemical tank to the substrate processing apparatus and recirculating the remaining liquid chemical not supplied to the substrate processing apparatus to the first and second liquid chemical tanks.

According to another aspect of the present invention, there is provided a liquid chemical tank module including a tank body having a storage space capable of storing a liquid chemical, a plurality of gas ejectors mounted in the tank body to eject an inert gas into the liquid chemical stored in the storage space to reduce dissolved oxygen in the liquid chemical stored in the storage space of the tank body, a sensor for sensing a level of the liquid chemical stored in the storage space of the tank body, and a controller for applying a control signal to the gas ejectors to control a flow rate of the inert gas ejected through the gas ejectors, based on level information of the liquid chemical received from the sensor, wherein the gas ejectors include a first gas ejector mounted at a side of the tank body to eject the inert gas into the storage space or the liquid chemical stored in the storage space, and a second gas ejector mounted at another side of the tank body to face the first gas ejector to eject the inert gas into the storage space or the liquid chemical stored in the storage space, wherein the sensor includes a plurality of level sensors corresponding to the number of a plurality of ejection nozzles, mounted on the gas pipe, and positioned individually adjacent to the plurality of ejection nozzles to sense the liquid chemical, wherein the plurality of ejection nozzles include a first ejection nozzle provided on the gas pipe at a predetermined height from a bottom surface of the storage space so as to be positioned at a height adjacent to the bottom surface, a second ejection nozzle provided above the first ejection nozzle on the gas pipe so as to be spaced apart from the first ejection nozzle by a first interval, and an nth ejection nozzle provided above an (n−1)th ejection nozzle on the gas pipe so as to be spaced apart from the (n−1)th ejection nozzle by the first interval, wherein the plurality of level sensors include a first level sensor mounted above the first ejection nozzle on the gas pipe so as to be adjacent to and spaced apart from the first ejection nozzle by a second interval less than the first interval, a second level sensor mounted above the second ejection nozzle on the gas pipe so as to be adjacent to and spaced apart from the second ejection nozzle by the second interval, and an nth level sensor mounted above the nth ejection nozzle on the gas pipe so as to be adjacent to and spaced apart from the nth ejection nozzle by the second interval, and wherein the controller receives the level information of the liquid chemical from the sensor and applies a control signal to the gas ejector in such a manner that a flow rate of the inert gas ejected through ejection nozzles dipped in the liquid chemical from among the plurality of ejection nozzles is higher than a flow rate of the inert gas ejected through ejection nozzles not dipped in the liquid chemical, and feedback-controls the flow rate of the inert gas ejected through the ejection nozzles dipped in the liquid chemical based on the level information of the liquid chemical in such a manner that a total flow rate of the inert gas ejected through the ejection nozzles dipped in the liquid chemical is constantly maintained regardless of a change in the number of ejection nozzles dipped in the liquid chemical based on a change in the level of the liquid chemical.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
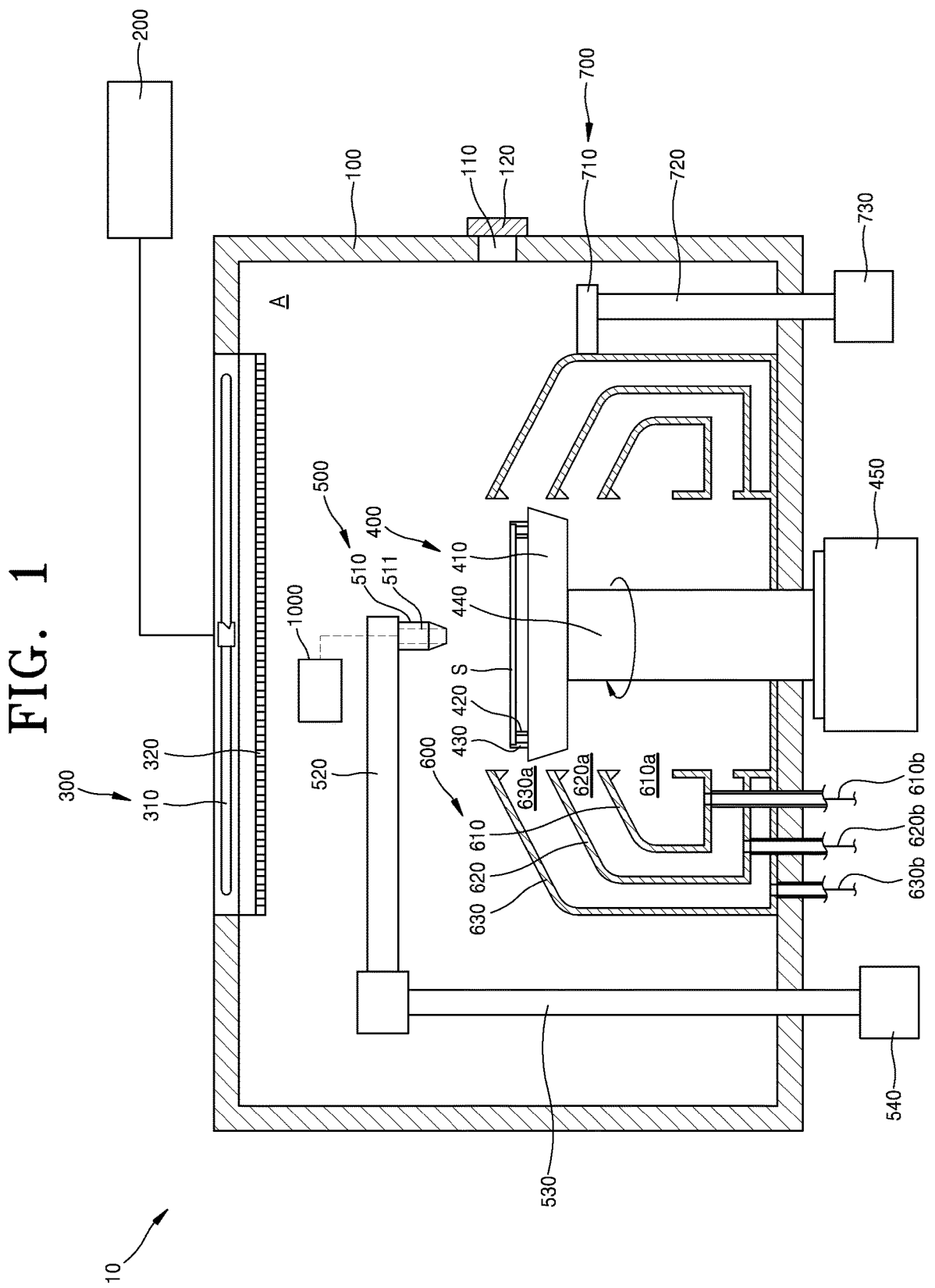
FIG. 1 is a cross-sectional view of a substrate processing apparatus including a liquid chemical supply apparatus, according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 2:
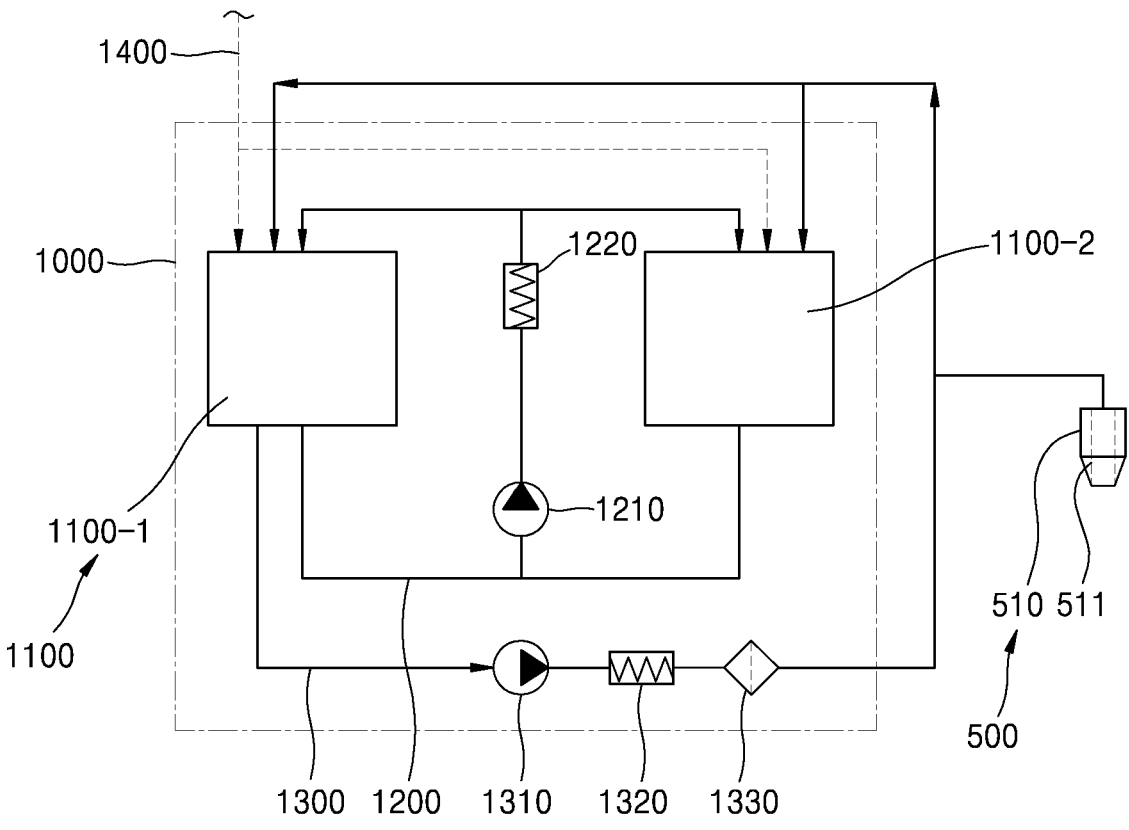
FIG. 2 is a schematic view of a liquid chemical supply apparatus according to an embodiment of the present invention.
Figure 3:
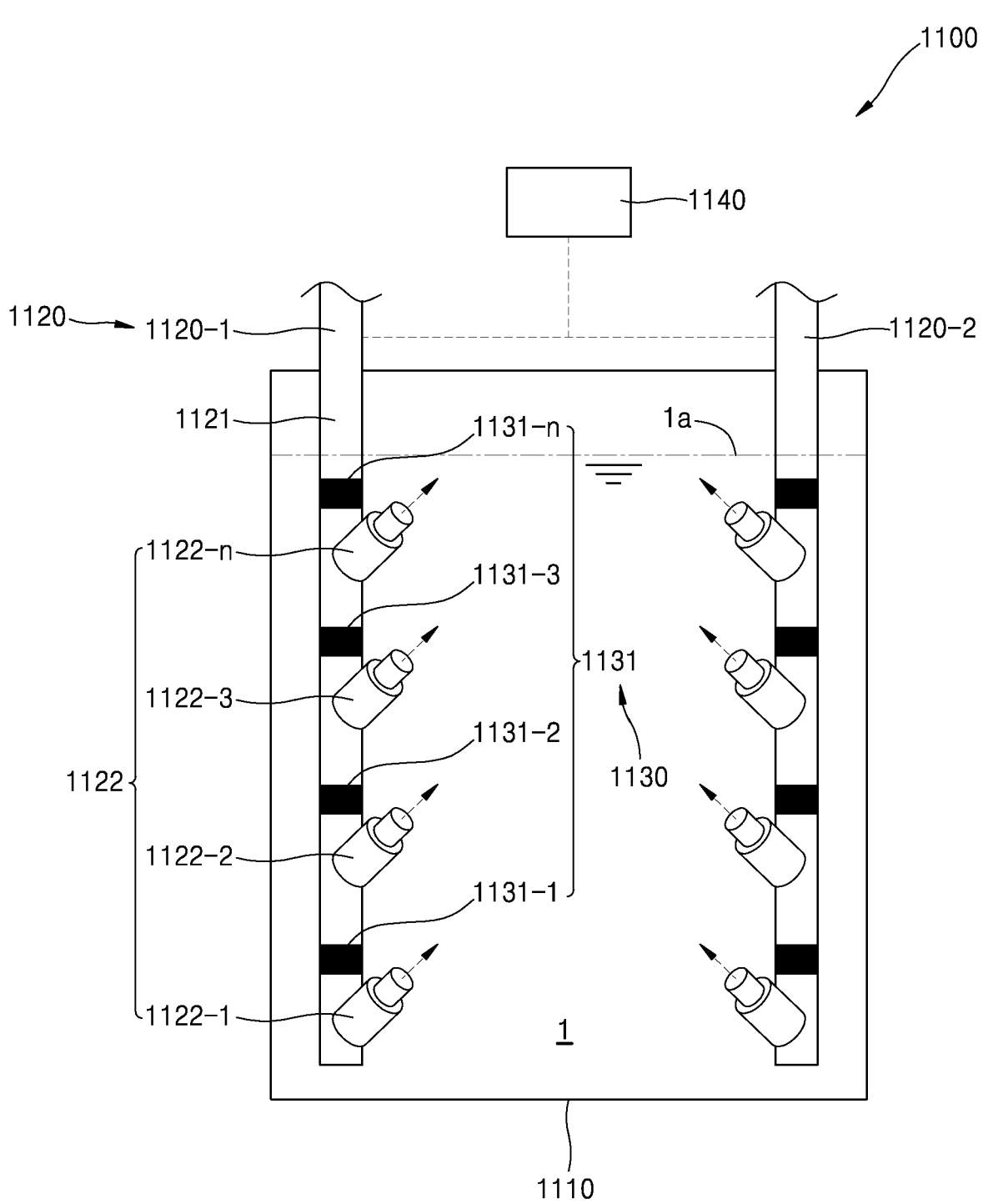
FIG. 3 is a schematic view showing an example of a liquid chemical tank module included in the liquid chemical supply apparatus of FIG. 2.

FIG. 1 is a cross-sectional view of a substrate processing apparatus 10 including a liquid chemical supply apparatus 1000, according to an embodiment of the present invention, and FIG. 2 is a schematic view of the liquid chemical supply apparatus 1000 according to an embodiment of the present invention. FIG. 3 is a schematic view showing an example of a liquid chemical tank module 1100 included in the liquid chemical supply apparatus 1000 of FIG. 2, FIGS. 4 to 6 are schematic views showing other examples of the liquid chemical tank module 1100 included in the liquid chemical supply apparatus 1000 of FIG. 2, and FIGS. 7 to 10 are sequential schematic views showing a procedure of ejecting an inert gas from a gas ejector 1120 in the liquid chemical tank module 1100 of FIG. 3.

Initially, as shown in FIG. 1, the substrate processing apparatus 10 including the liquid chemical supply apparatus 1000 according to an embodiment of the present invention may mainly include a chamber 100, a gas supply unit 200, a fan filter unit 300, a substrate support unit 400, a liquid chemical spray unit 500, a collection unit 600, and a lifting unit 700.

As shown in FIG. 1, the chamber 100 may have a processing space A in which a cleaning process of a substrate S is performed. For example, the chamber 100 may have a rectangular, polygonal, or circular cylinder shape to provide the processing space A in which the cleaning process of the substrate S is performed.

The chamber 100 may include a gate 110 provided on a surface thereof facing a transfer chamber (not shown), and the gate 110 may be closed by a door 120. The gate 110 may function as an entrance through which the substrate S may enter.

As shown in FIG. 1, as a kind of spin head, the substrate support unit 400 may be mounted in the processing space A inside the chamber 100 to support and rotate the substrate S during the cleaning process.

Specifically, the substrate support unit 400 may include a spin body 410, support pins 420, chuck pins 430, and a support shaft 440, and the spin body 410 may have a substantially circular upper surface when viewed from above. The support shaft 440 rotatably driven by a driving unit 450 may be fixed and coupled to a lower surface of the spin body 410.

A plurality of support pins 420 may be provided on the upper surface of the spin body 410 of the substrate support unit 400. For example, a plurality of support pins 420 may be arranged at predetermined intervals along an edge of the upper surface of the spin body 410 and thus provided radially and equiangularly from a central axis (or a rotation axis) of the spin body 410. As described above, the support pins 420 may be arranged in a circular ring shape overall to support an edge of a rear surface of the substrate S such that the substrate S is spaced apart from the upper surface of the spin body 410 by a predetermined distance.

A plurality of chuck pins 430 may be provided on the upper surface of the spin body 410 of the substrate support unit 400 and disposed further away from the central axis of the spin body 410 than the support pins 420. These chuck pins 430 may protrude more than the support pins 420 from the upper surface of the spin body 410 to support a side surface of the substrate S to prevent lateral dislocation of the substrate S due to centrifugal force when the spin body 410 rotates.

The chuck pins 430 may be mounted to linearly move between a standby position and a support position which are spaced apart from each other by a predetermined distance along a radial direction of the spin body 410. For example, the standby position may be a position farther from the central axis of the spin body 410 compared to the support position. As such, the chuck pins 430 may be positioned at the standby position when the substrate S is loaded onto or unloaded from the spin body 410, and linearly move and be positioned at the support position when the cleaning process is performed on the substrate S. At the support position, the chuck pins 430 may be in contact with the side surface of the substrate S.

As shown in FIG. 1, the collection unit 600 may be provided in a cylinder shape with an open top to surround the substrate support unit 400 and mounted in the processing space A to collect a liquid chemical scattered from the substrate S when the substrate S rotates.

For example, the collection unit 600 may have a cylinder shape with an open top overall and include an inner collection barrel 610, a middle collection barrel 620, and an outer collection barrel 630. The collection barrels 610, 620, and 630 may collect different liquid chemicals used for the cleaning process.

Specifically, the inner collection barrel 610 may be provided in a circular ring shape surrounding the substrate support unit 400, the middle collection barrel 620 may be provided in a circular ring shape surrounding the inner collection barrel 610, and the outer collection barrel 630 may be provided in a circular ring shape surrounding the middle collection barrel 620. A first space 610a of the inner collection barrel 610, a second space 620a of the middle collection barrel 620, and a third space 630a of the outer collection barrel 630 may function as inlets through which the liquid chemicals flow into the inner collection barrel 610, the middle collection barrel 620, and the outer collection barrel 630, respectively.

For example, the inlets of the collection barrels 610, 620, and 630 may be positioned at different heights, and collection lines 610b, 620b, and 630b may be connected to bottom surfaces of the collection barrels 610, 620, and 630, respectively. The collection lines 610b, 620b, and 630b may discharge the liquid chemicals collected by the collection barrels 610, 620, and 630, respectively, and the discharged liquid chemicals may be recycled and reused through an external liquid chemical recycling system (not shown).

As shown in FIG. 1, the lifting unit 700 may lift or lower the collection unit 600 in a vertical direction. When the collection unit 600 is lifted or lowered by the lifting unit 700, a height of the collection unit 600 relative to the substrate support unit 400 may be changed.

The lifting unit 700 may include a bracket 710, a moving shaft 720, and a driving device 730. For example, the bracket 710 may be fixed and mounted on an outer wall of the collection unit 600, and the moving shaft 720 moved in a vertical direction by the driving device 730 may be fixed and coupled to the bracket 710.

Specifically, when the substrate S is loaded onto or unloaded from the substrate support unit 400, the collection unit 600 may be lowered by the lifting unit 700 such that the substrate support unit 400 protrudes upward from the collection unit 600. When the cleaning process is performed, the height of the collection unit 600 may be adjusted in accordance with the type of a liquid chemical supplied to the substrate S such that the liquid chemical may flow into a preset collection barrel 610, 620, or 630.

As shown in FIG. 1, the gas supply unit 200 may supply air to the processing space A of the chamber 100. For example, the gas supply unit 200 may supply temperature- and humidity-controlled air to the processing space A of the chamber 100. To this end, although not shown in the drawings, the gas supply unit 200 may include a gas receiver provided with a filter to receive impurity-removed gas from the outside, a buffer for temporarily storing the received gas, a humidity controller for controlling a humidity of the gas, and a temperature controller for controlling a temperature of the gas.

As shown in FIG. 1, the fan filter unit 300 may be mounted on the chamber 100 to blow the air supplied from the gas supply unit 200, into the processing space A. Specifically, the fan filter unit 300 may include a blower fan 310 for generating blowing force to blow the air into the processing space A, and a perforated plate 320 including a plurality of holes and provided in a flat plate shape having an area corresponding to a range of rotation of the blower fan 310. In this case, the plurality of holes may be uniformly provided in the perforated plate 320 at regular intervals to induce the air supplied from the gas supply unit 200 to be uniformly spread and blown into the processing space A of the chamber 100.

As shown in FIG. 1, the liquid chemical spray unit 500 may be mounted above the substrate support unit 400 in the processing space A to spray at least one type of liquid chemical onto the substrate S. For example, the liquid chemical spray unit 500 may receive a plurality of liquid chemicals from the liquid chemical supply apparatus 1000 to be described below and spray the same onto the substrate S, and a plurality of liquid chemical spray units 500 may be mounted. The liquid chemical spray unit 500 may mainly include a spray nozzle 510, a support bar 520, and a support shaft 530.

For example, the support shaft 530 may be disposed at a side of the collection unit 600 and rotated or lifted by a driving member 540. The support bar 520 may have an end coupled to the support shaft 530 to support the spray nozzle 510 mounted at another end thereof.

The spray nozzle 510 may be swung above the substrate support unit 400 by the rotation of the support shaft 530. Herein, the liquid chemical supplied from the liquid chemical supply apparatus 1000 to be described below and sprayed through the spray nozzle 510 may be a chemical solution, a rinsing liquid, or a liquid organic solvent, and the supply of the liquid chemical may be controlled by the liquid chemical supply apparatus 1000.

Specifically, as shown in FIGS. 1 and 2, in the substrate processing apparatus 10, the spray nozzle 510 of the liquid chemical spray unit 500, which is mounted above the substrate support unit 400 for supporting and rotating the substrate S and sprays the liquid chemical onto the substrate S, may have a spray passage 511, in which the liquid chemical flows, to spray the liquid chemical through an ejection hole provided at a lower end thereof.

The liquid chemical supply apparatus 1000 for supplying the liquid chemical to the above-described liquid chemical spray unit 500 of the substrate processing apparatus 10, and the liquid chemical tank module 1100 included in the liquid chemical supply apparatus 1000 will now be described in detail.

As shown in FIGS. 1 and 2, the liquid chemical supply apparatus 1000 may receive different liquid chemicals from an external liquid chemical supply source (not shown) into the liquid chemical tank module 1100 through a liquid chemical supply line 1400, mix the liquid chemicals, and supply the liquid chemical, a temperature, a concentration, etc. of which are controlled appropriately for process conditions, to the liquid chemical spray unit 500.

The liquid chemical supply apparatus 1000 may have a dual tank structure and include a first liquid chemical tank 1100-1 for supplying the liquid chemical to the liquid chemical spray unit 500 of the substrate processing apparatus 10 for processing the substrate S, and a second liquid chemical tank 1100-2 connected to the first liquid chemical tank 1100-1 through at least one circulation line to circulate the liquid chemical to the first liquid chemical tank 1100-1 and control the liquid chemical to a target temperature and a target concentration suitable for process conditions.

The liquid chemical supply apparatus 1000 may further include an inner circulation line 1200 for circulating the liquid chemical of the first and second liquid chemical tanks 1100-1 and 1100-2 and controlling the liquid chemical to the target temperature and the target concentration while the liquid chemical is being circulated, and an outer circulation line 1300 for supplying the liquid chemical stored in the first liquid chemical tank 1100-1 to the liquid chemical spray unit 500 of the substrate processing apparatus 10 and recirculating the remaining liquid chemical not supplied to the substrate processing apparatus 10 to the first and second liquid chemical tanks 1100-1 and 1100-2.

Specifically, on the inner circulation line 1200, a pump 1210 for circulating the liquid chemical of the first and second liquid chemical tanks 1100-1 and 1100-2, a heater 1220 for controlling the circulated liquid chemical to the target temperature suitable for the process conditions, and a concentration meter (not shown) for controlling the concentration of the circulated liquid chemical may be mounted.

On the outer circulation line 1300, a pump 1310 for supplying the liquid chemical from the first liquid chemical tank 1100-1 to the liquid chemical spray unit 500 of the substrate processing apparatus 10, a heater 1320 for maintaining the supplied liquid chemical at the target temperature suitable for the process conditions, and a filter 1330 for removing foreign substances included in the liquid chemical may be mounted. In this case, the heater 1320 may be provided as, for example, a thermostat.

In the above-described liquid chemical supply apparatus 1000, as shown in FIG. 3, the liquid chemical tank module 1100 in which the liquid chemical is stored, e.g., each of the first and second liquid chemical tanks 1100-1 and 1100-2, may mainly include a tank body 1110, a gas ejector 1120, a sensor 1130, and a controller 1140.

For example, as shown in FIG. 3, the tank body 1110 may be provided in a rectangular, circular, or polygonal cylinder shape and have a storage space capable of storing a liquid chemical 1.

The gas ejector 1120 may eject an inert gas into the storage space and the liquid chemical 1 stored in the storage space to reduce dissolved oxygen in the liquid chemical 1 stored in the storage space of the tank body 1110. Herein, the inert gas may use nitrogen gas ($N_2$) or any other inert gas that does not combine with other elements so as not to affect the liquid chemical 1 may also be used.

For example, the gas ejector 1120 may include a gas pipe 1121 extending into the storage space through a surface of the tank body 1110 in a height direction of the tank body 1110 and at least partially dipped in the liquid chemical 1 stored in the storage space to supply the inert gas from the outside of the tank body 1110 into the storage space, and a plurality of ejection nozzles 1122 provided at predetermined intervals along the extension direction of the gas pipe 1121 to eject the inert gas into the storage space or the liquid chemical 1 stored in the storage space.

A plurality of gas ejectors 1120 may be mounted in the tank body 1110. For example, the gas ejectors 1120 may include a first gas ejector 1120-1 mounted at a side of the tank body 1110 to eject the inert gas into the storage space or the liquid chemical 1 stored in the storage space, and a second gas ejector 1120-2 mounted at another side of the tank body 1110 to face the first gas ejector 1120-1 to eject the inert gas into the storage space or the liquid chemical 1 stored in the storage space.

However, the number of gas ejectors 1120 is not limited to the illustration of FIG. 3 and various numbers of gas ejectors 1120, e.g., three or four gas ejectors 1120 disposed radially from the center of the tank body 1110, may be mounted to effectively reduce dissolved oxygen in the liquid chemical 1 stored in the storage space of the tank body 1110.

As shown in FIG. 3, the plurality of ejection nozzles 1122 for ejecting the inert gas from the gas ejector 1120 may include a first ejection nozzle 1122-1 provided on the gas pipe 1121 at a predetermined height from a bottom surface of the storage space so as to be positioned at a height adjacent to the bottom surface, a second ejection nozzle 1122-2 provided above the first ejection nozzle 1122-1 on the gas pipe 1121 so as to be spaced apart from the first ejection nozzle 1122-1 by a first interval, a third ejection nozzle 1122-3 provided above the second ejection nozzle 1122-2 on the gas pipe 1121 so as to be spaced apart from the second ejection nozzle 1122-2 by the first interval, and an nth ejection nozzle 1122-$n$ provided above an (n–1)st ejection nozzle on the gas pipe 1121 so as to be spaced apart from the (n–1)st ejection nozzle by the first interval.

In the current embodiment, although four ejection nozzles 1122 are provided along the extension direction of the gas pipe 1121 at the first interval, the number of ejection nozzles 1122 is not limited to the illustration of FIG. 3 and various numbers of ejection nozzles 1122 may be mounted to effectively reduce dissolved oxygen in the liquid chemical 1 stored in the storage space in consideration of the height of the tank body 1110.

As shown in FIG. 3, the plurality of ejection nozzles 1122 may be tilted upward at a predetermined angle to the gas pipe 1121 based on the extension direction of the gas pipe 1121 to eject the inert gas diagonally toward a surface 1a of the liquid chemical 1 stored in the storage space of the tank body 1110.

For example, the predetermined angle may be 40° to 50°, and more specifically, 45°.

As described above, the inert gas ejected through the plurality of ejection nozzles 1122 tilted upward from the gas pipe 1121 may be induced to flow toward the surface 1a of the liquid chemical 1 and then toward the bottom of the liquid chemical 1 and thus uniformly spread throughout the liquid chemical 1 to reduce dissolved oxygen in the liquid chemical 1 more effectively.

Figure 4:
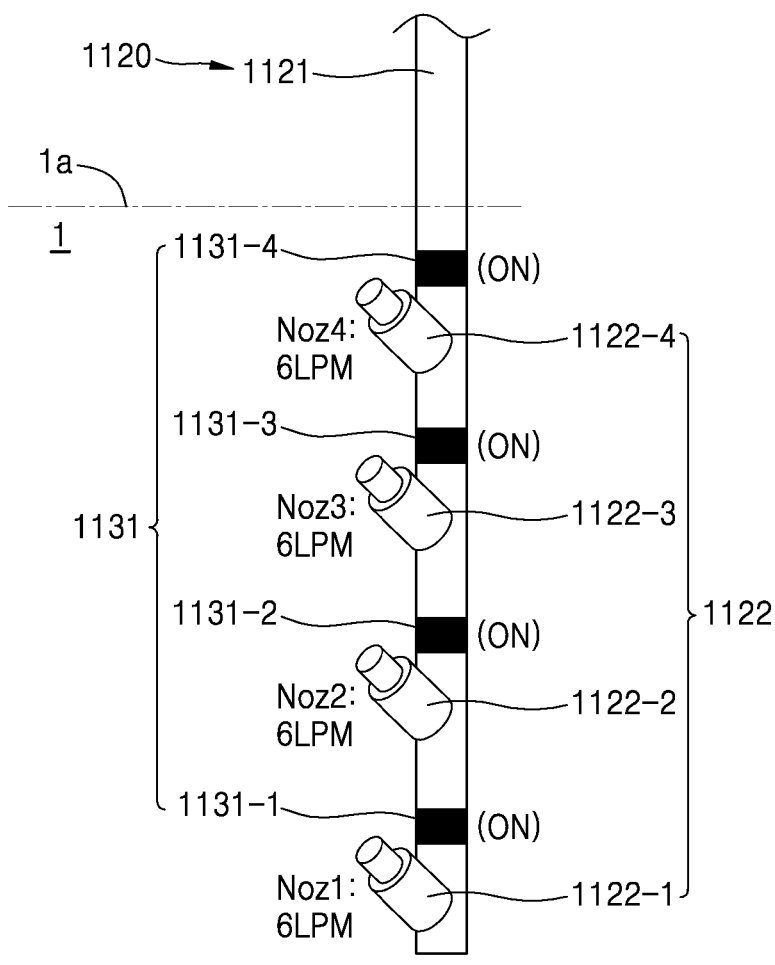
FIGS. 4 to 6 are schematic views showing other examples of the liquid chemical tank module included in the liquid chemical supply apparatus of FIG. 2.

However, the angle of the plurality of ejection nozzles 1122 is not limited to the illustration of FIG. 3 and, as shown in FIG. 4, when necessary, the plurality of ejection nozzles 1122 may be provided perpendicularly to the gas pipe 1121 based on the extension direction of the gas pipe 1121 to eject the inert gas in a direction parallel to the surface 1a of the liquid chemical 1 stored in the storage space of the tank body 1110.

As shown in FIG. 3, the sensor 1130 may sense a level of the liquid chemical 1 stored in the storage space of the tank body 1110.

For example, the sensor 1130 may include a plurality of level sensors 1131 corresponding to the number of the plurality of ejection nozzles 1122, mounted on the gas pipe 1121, and positioned individually adjacent to the ejection nozzles 1122-1, 1122-2, 1122-3, and 1122-$n$ of the plurality of ejection nozzles 1122 to sense the liquid chemical 1.

Specifically, as shown in FIG. 3, the plurality of level sensors 1131 may include a first level sensor 1131-1 mounted above the first ejection nozzle 1122-1 on the gas pipe 1121 so as to be adjacent to and spaced apart from the first ejection nozzle 1122-1 by a second interval less than the first interval, a second level sensor 1131-2 mounted above the second ejection nozzle 1122-2 on the gas pipe 1121 so as to be adjacent to and spaced apart from the second ejection nozzle 1122-2 by the second interval, a third level sensor 1131-3 mounted above the third ejection nozzle 1122-3 on the gas pipe 1121 so as to be adjacent to and spaced apart from the third ejection nozzle 1122-3 by the second interval, and an nth level sensor 1131-n mounted above the nth ejection nozzle 1122-n on the gas pipe 1121 so as to be adjacent to and spaced apart from the nth ejection nozzle 1122-n by the second interval.

In the current embodiment, although four level sensors 1131 are provided along the extension direction of the gas pipe 1121 to individually correspond to the plurality of ejection nozzles 1122, the number of level sensors 1131 is not limited to the illustration of FIG. 3 and various numbers of level sensors 1131 may be provided to individually correspond to the plurality of ejection nozzles 1122.

Figure 5:
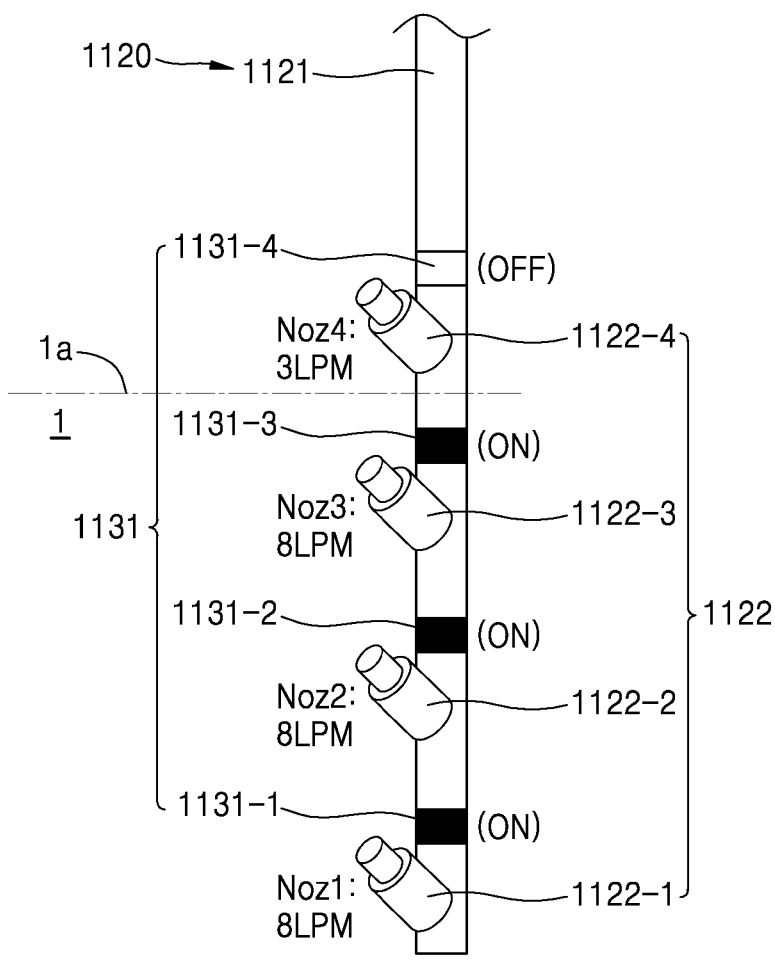

In the current embodiment, although the plurality of level sensors 1131 are mounted on both the first and second gas ejectors 1120-1 and 1120-2, the plurality of level sensors 1131 are not limited to the illustration of FIG. 3 and may be mounted on one of the first and second gas ejectors 1120-1 and 1120-2 as shown in FIG. 5.

Figure 6:
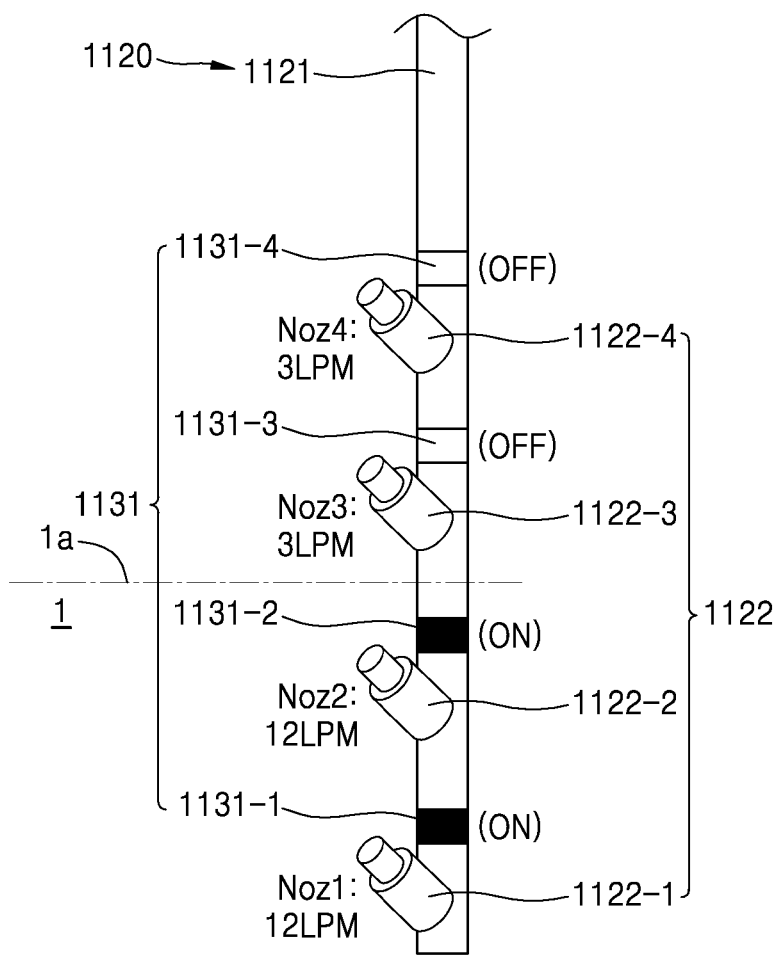

The sensor 1130 is not limited to the plurality of level sensors 1131 and may include a liquid height sensor 1132 mounted at an upper side of the tank body 1110 to measure the level 1a of the liquid chemical 1 stored in the storage space in a non-contact manner by using ultrasonic waves or laser beams as shown in FIG. 6.

As shown in FIG. 3, the controller 1140 may apply a control signal to the gas ejector 1120 to control a flow rate of the inert gas ejected through the gas ejector 1120, based on the level 1a of the liquid chemical 1 sensed by the sensor 1130 mounted on the gas ejector 1120.

For example, the controller 1140 may receive level information of the liquid chemical 1 from the sensor 1130 and apply a control signal to the gas ejector 1120 in such a manner that a flow rate of the inert gas ejected through ejection nozzles dipped in the liquid chemical 1 from among the plurality of ejection nozzles 1122 is higher than a flow rate of the inert gas ejected through ejection nozzles not dipped in the liquid chemical 1, and feedback-control the flow rate of the inert gas ejected through the ejection nozzles dipped in the liquid chemical 1 based on the level information of the liquid chemical 1 in such a manner that a total flow rate of the inert gas ejected through the ejection nozzles dipped in the liquid chemical 1 is constantly maintained regardless of a change in the number of ejection nozzles dipped in the liquid chemical 1 based on a change in the level of the liquid chemical 1.

Specifically, when the number of ejection nozzles dipped in the liquid chemical 1 is increased due to an increase in the level of the liquid chemical 1, the controller 1140 may apply a control signal to the gas ejector 1120 to reduce the flow rate of the inert gas ejected through the ejection nozzles dipped in the liquid chemical 1 in such a manner that the total flow rate of the inert gas ejected through the ejection nozzles dipped in the liquid chemical 1 is constantly maintained. On the contrary, when the number of ejection nozzles dipped in the liquid chemical 1 is reduced due to a reduction in the level of the liquid chemical 1, the controller 1140 may apply a control signal to the gas ejector 1120 to increase the flow rate of the inert gas ejected through the ejection nozzles dipped in the liquid chemical 1 in such a manner that the total flow rate of the inert gas ejected through the ejection nozzles dipped in the liquid chemical 1 is constantly maintained.

In this case, the controller 1140 may apply a control signal to the gas ejector 1120 in such a manner that the inert gas is ejected equally at a first flow rate through the ejection nozzles dipped in the liquid chemical 1 and ejected equally at a second flow rate through the ejection nozzles not dipped in the liquid chemical 1, and that the first flow rate is higher than the second flow rate.

Figure 7:
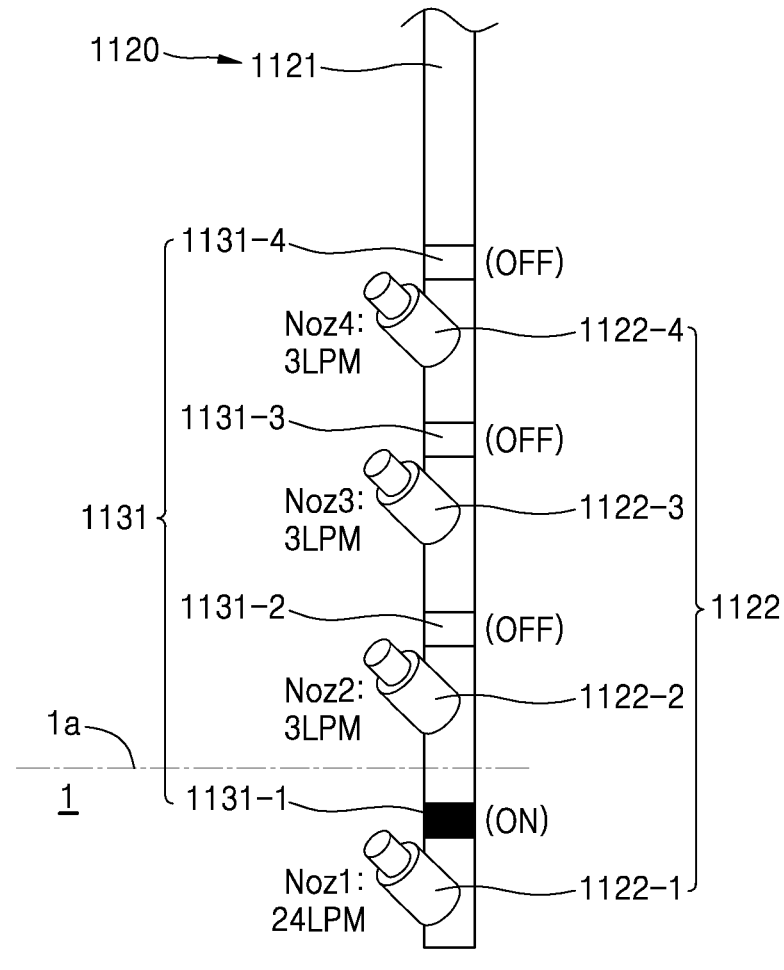
FIGS. 7 to 10 are sequential schematic views showing a procedure of ejecting an inert gas from a gas ejector in the liquid chemical tank module of FIG. 3.

An example of a procedure of ejecting the inert gas by the control of the above-described controller 1140 will now be described. Initially, as shown in FIG. 7, while a total flow rate of the inert gas to be ejected into the liquid chemical 1 is set to 24 liters per minute (LPM), when the level 1a of the liquid chemical 1 is high enough to dip all four level sensors 1131-1, 1131-2, 1131-3, and 1131-4 in the liquid chemical 1, all of the four level sensors 1131-1, 1131-2, 1131-3, and 1131-4 may apply an ON signal to the controller 1140, and the controller 1140 may determine that all four ejection nozzles 1122-1, 1122-2, 1122-3, and 1122-4 corresponding thereto are dipped in the liquid chemical 1, and apply a control signal to the gas ejector 1120 to eject the inert gas equally at a flow rate of 6 LPM through the four ejection nozzles 1122-1, 1122-2, 1122-3, and 1122-4 in consideration of the total flow rate of 24 LPM.

Figure 8:
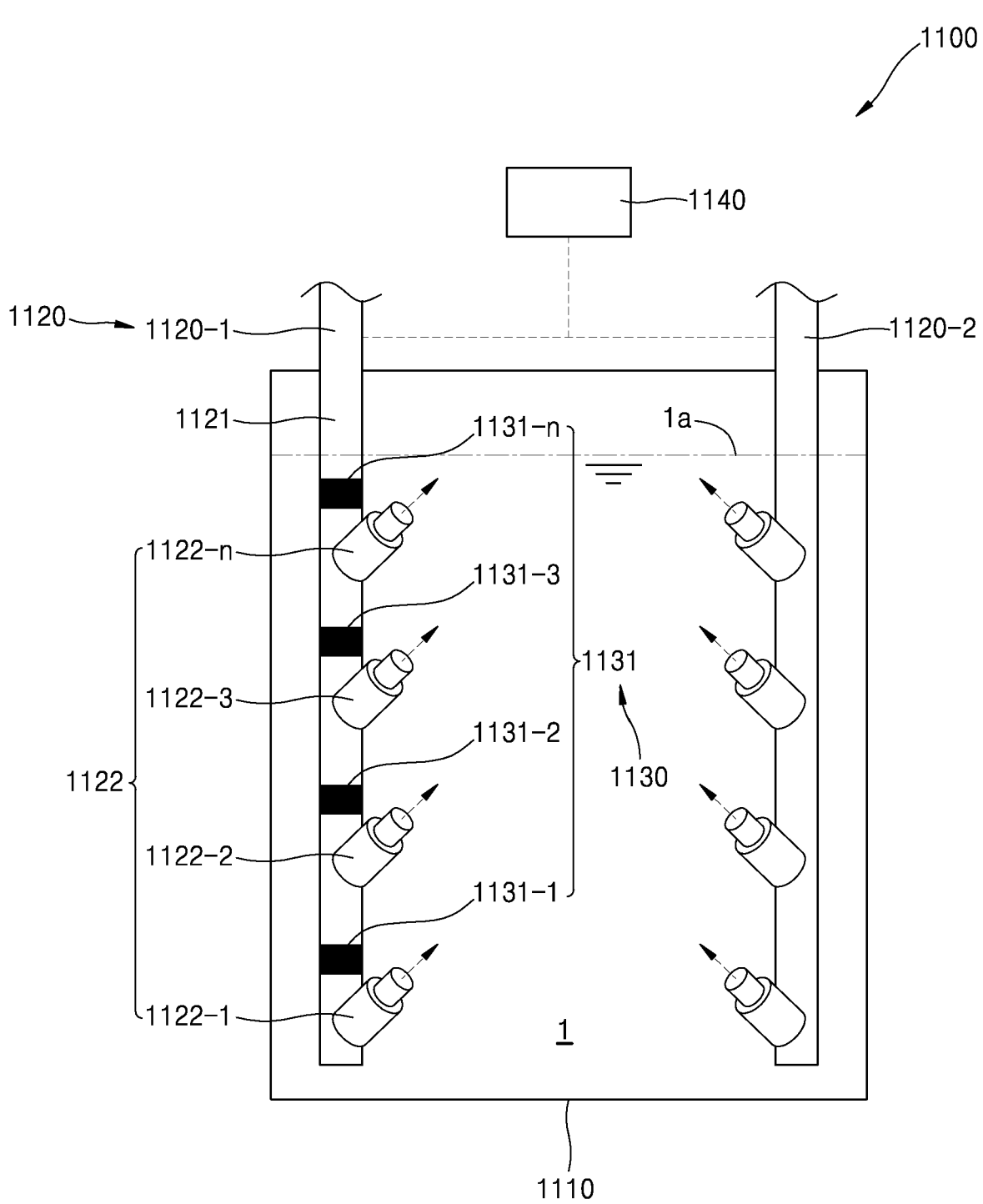

Then, as shown in FIG. 8, when a cleaning process of the substrate S is performed and thus the level 1a of the liquid chemical 1 is reduced to dip three level sensors 1131-1, 1131-2, and 1131-3 in the liquid chemical 1, the three level sensors 1131-1, 1131-2, and 1131-3 may apply an ON signal to the controller 1140, and the controller 1140 may determine that three ejection nozzles 1122-1, 1122-2, and 1122-3 corresponding thereto are dipped in the liquid chemical 1, and apply a control signal to the gas ejector 1120 to eject the inert gas equally at a flow rate of 8 LPM through the three ejection nozzles 1122-1, 1122-2, and 1122-3 in consideration of the total flow rate of 24 LPM.

In this case, the controller 1140 may apply the control signal to eject the inert gas through the ejection nozzle 1122-4 not dipped in the liquid chemical 1 at a flow rate of 3 LPM lower than the flow rate of the inert gas ejected through the ejection nozzles 1122-1, 1122-2, and 1122-3 dipped in the liquid chemical 1.

Figure 9:
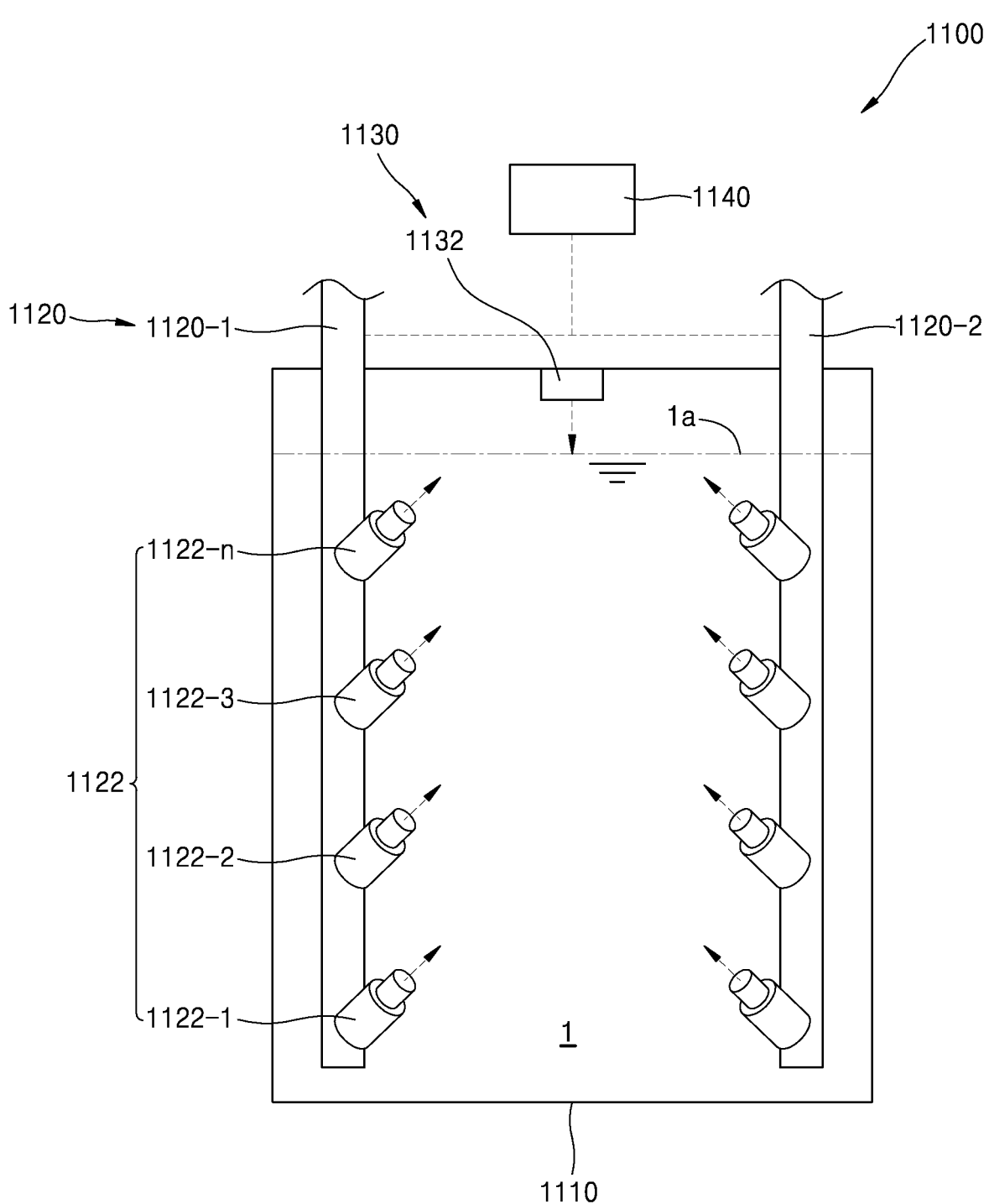

Then, as shown in FIG. 9, when the cleaning process of the substrate S is continuously performed and thus the level 1a of the liquid chemical 1 is further reduced to dip two level sensors 1131-1 and 1131-2 in the liquid chemical 1, the two level sensors 1131-1 and 1131-2 may apply an ON signal to the controller 1140, and the controller 1140 may determine that two ejection nozzles 1122-1 and 1122-2 corresponding thereto are dipped in the liquid chemical 1, and apply a control signal to the gas ejector 1120 to eject the inert gas equally at a flow rate of 12 LPM through the two ejection nozzles 1122-1 and 1122-2 in consideration of the total flow rate of 24 LPM.

In this case, the controller 1140 may apply the control signal to eject the inert gas through the ejection nozzles 1122-3 and 1122-4 not dipped in the liquid chemical 1 at a flow rate of 3 LPM lower than the flow rate of the inert gas ejected through the ejection nozzles 1122-1 and 1122-2 dipped in the liquid chemical 1.

Figure 10:
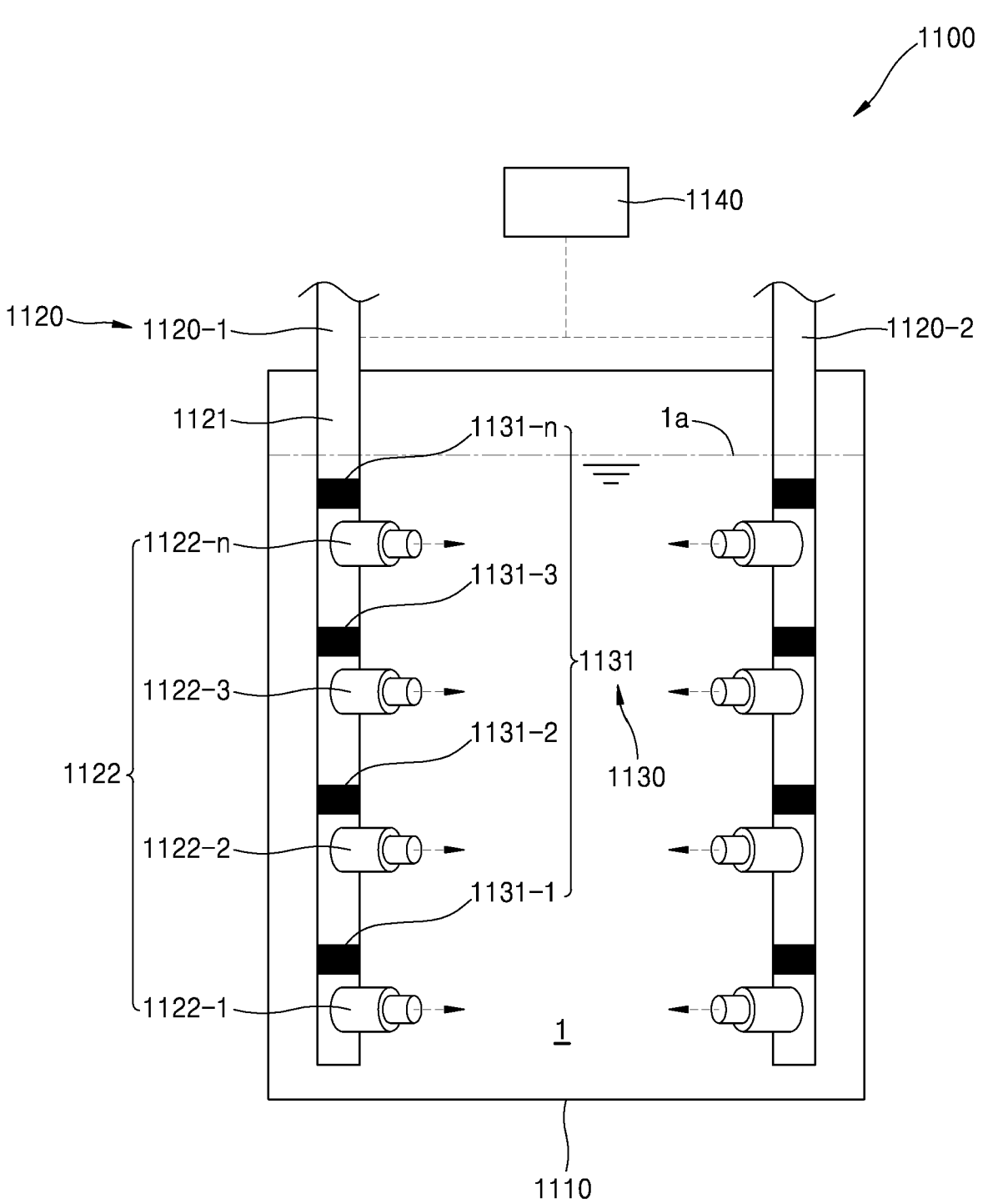

Then, as shown in FIG. 10, when the cleaning process of the substrate S is continuously performed and thus the level 1a of the liquid chemical 1 is further reduced to dip one level sensor 1131-1 in the liquid chemical 1, the one level sensor 1131-1 may apply an ON signal to the controller 1140, and the controller 1140 may determine that one ejection nozzle 1122-1 corresponding thereto is dipped in the liquid chemical 1, and apply a control signal to the gas ejector 1120 to eject the inert gas at a flow rate of 24 LPM through the one ejection nozzle 1122-1 in consideration of the total flow rate of 24 LPM.

In this case, the controller 1140 may apply the control signal to eject the inert gas through the ejection nozzles 1122-2, 1122-3, and 1122-4 not dipped in the liquid chemical 1 at a flow rate of 3 LPM lower than the flow rate of the inert gas ejected through the ejection nozzle 1122-1 dipped in the liquid chemical 1.

Therefore, based on the liquid chemical tank module 1100 and the liquid chemical supply apparatus 1000 including the same, according to various embodiments of the present invention, during a cleaning process of the substrate S, by ejecting nitrogen gas ($N_2$) into the liquid chemical tank module 1100 of the liquid chemical supply apparatus 1000 for supplying a liquid chemical, dissolved oxygen in the liquid chemical remaining inside the liquid chemical tank module 1100 may be reduced. As such, an etch rate (ER) of the liquid chemical may be constantly maintained.

Furthermore, a total flow rate of the nitrogen gas ejected into the liquid chemical may be constantly maintained all the time by controlling a flow rate of the nitrogen gas ejected through each ejection nozzle based on the number of ejection nozzles dipped in the liquid chemical from among the plurality of ejection nozzles 1122 in association with a level of the liquid chemical remaining in the liquid chemical tank module 1100, thereby increasing convenience of system operation and inducing the liquid chemical to always maintain a low level of dissolved oxygen.

In addition, by ejecting the nitrogen gas even through ejection nozzles not dipped in the liquid chemical from among the plurality of ejection nozzles 1122 to eject the nitrogen gas not only into the liquid chemical but also onto the liquid chemical in the liquid chemical tank module 1100 (where a flow rate of the nitrogen gas ejected onto the liquid chemical differs from the flow rate of the nitrogen gas ejected into the liquid chemical), the introduction of oxygen into the liquid chemical tank module 1100 may be fundamentally and structurally blocked and thus an increase in dissolved oxygen inside the liquid chemical tank module 1100 may be more efficiently prevented.

According to the afore-described embodiments of the present invention, during a cleaning process of a substrate, by ejecting nitrogen gas ($N_2$) into a liquid chemical tank module of a liquid chemical supply apparatus for supplying a liquid chemical, dissolved oxygen in the liquid chemical remaining inside the liquid chemical tank module may be reduced. As such, an ER of the liquid chemical may be constantly maintained.

Furthermore, a total flow rate of the nitrogen gas ejected into the liquid chemical may be constantly maintained all the time by controlling a flow rate of the nitrogen gas ejected through each ejection nozzle based on the number of ejection nozzles dipped in the liquid chemical from among a plurality of ejection nozzles in association with a level of the liquid chemical remaining in the liquid chemical tank module, thereby increasing convenience of system operation and inducing the liquid chemical to always maintain a low level of dissolved oxygen.

In addition, by ejecting the nitrogen gas even through ejection nozzles not dipped in the liquid chemical from among the plurality of ejection nozzles to eject the nitrogen gas not only into the liquid chemical but also onto the liquid chemical in the liquid chemical tank module (where a flow rate of the nitrogen gas ejected onto the liquid chemical differs from the flow rate of the nitrogen gas ejected into the liquid chemical), the introduction of oxygen into the liquid chemical tank module may be fundamentally and structurally blocked and thus a liquid chemical tank module capable of more efficiently preventing an increase in dissolved oxygen inside the liquid chemical tank module, and a liquid chemical supply apparatus including the same may be implemented. However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A liquid chemical tank module comprising:
   a tank body having a storage space capable of storing a liquid chemical;
   a plurality of gas ejectors configured to eject an inert gas into the liquid chemical stored in the storage space to reduce dissolved oxygen in the liquid chemical stored in the storage space of the tank body; and
   a controller configured to apply a control signal to the plurality of gas ejectors to control a flow rate of the inert gas ejected through the plurality of gas ejectors,
   wherein each gas ejector of the plurality of gas ejectors comprises:
      a gas pipe extending into the storage space through a surface of the tank body in a height direction of the tank body and at least partially immersed in the liquid chemical stored in the storage space to supply the inert gas from outside of the tank body into the storage space; and
      a plurality of ejection nozzles provided at predetermined intervals along an extension direction of the gas pipe and configured to eject the inert gas into the storage space or the liquid chemical stored in the storage space,
   wherein the liquid chemical tank module further comprises:
      a plurality of level sensors corresponding to the number of the plurality of ejection nozzles, mounted on the gas pipe, and positioned individually adjacent to the plurality of ejection nozzles to sense the liquid chemical.

2. The liquid chemical tank module of claim 1, wherein the gas ejectors comprise:
   a first gas ejector mounted at one side of the tank body and configured to eject the inert gas into the storage space or the liquid chemical stored in the storage space; and
   a second gas ejector mounted at other side of the tank body to face the first gas ejector and configured to eject the inert gas into the storage space or the liquid chemical stored in the storage space.

3. The liquid chemical tank module of claim 1, wherein the plurality of ejection nozzles comprise:
   a first ejection nozzle provided on the gas pipe at a predetermined height from a bottom surface of the storage space so as to be positioned at a height adjacent to the bottom surface; and
   a second ejection nozzle provided above the first ejection nozzle on the gas pipe so as to be spaced apart from the first ejection nozzle by a first interval, and wherein the plurality of level sensors comprise:
   a first level sensor mounted above the first ejection nozzle on the gas pipe so as to be adjacent to and spaced apart from the first ejection nozzle by a second interval less than the first interval; and a second level sensor mounted above the second ejection nozzle on the gas pipe so as to be adjacent to and spaced apart from the second ejection nozzle by the second interval.

4. The liquid chemical tank module of claim 3, wherein the plurality of ejection nozzles further comprise an nth ejection nozzle provided above an (n–1)th ejection nozzle on the gas pipe so as to be spaced apart from the (n–1)th ejection nozzle by the first interval, and
wherein the plurality of level sensors further comprise an nth level sensor mounted above the nth ejection nozzle on the gas pipe so as to be adjacent to and spaced apart from the nth ejection nozzle by the second interval.

5. The liquid chemical tank module of claim 1, wherein the plurality of level sensors are mounted on at least one of the first and second gas ejectors.

6. The liquid chemical tank module of claim 1, wherein the controller is configured to receive level information of the liquid chemical from the plurality of level sensors and apply the control signal to the plurality of gas ejectors in such a manner that a flow rate of the inert gas ejected through ejection nozzles immersed in the liquid chemical among the plurality of ejection nozzles is higher than a flow rate of the inert gas ejected through ejection nozzles not immersed in the liquid chemical among the plurality of ejection nozzles.

7. The liquid chemical tank module of claim 6, wherein the controller is configured to feedback-control the flow rate of the inert gas ejected through the ejection nozzles immersed in the liquid chemical based on the level information of the liquid chemical in such a manner that a total flow rate of the inert gas ejected through the ejection nozzles immersed in the liquid chemical is constantly maintained regardless of a change in the number of ejection nozzles immersed in the liquid chemical based on a change in a level of the liquid chemical.

8. The liquid chemical tank module of claim 7, wherein, when the number of ejection nozzles immersed in the liquid chemical is increased due to an increase in the level of the liquid chemical, the controller is configured to apply the control signal to the plurality of gas ejectors to reduce the flow rate of the inert gas ejected through the ejection nozzles immersed in the liquid chemical in such a manner that the total flow rate of the inert gas ejected through the ejection nozzles immersed in the liquid chemical is constantly maintained.

9. The liquid chemical tank module of claim 7, wherein, when the number of ejection nozzles immersed in the liquid chemical is reduced due to a reduction in the level of the liquid chemical, the controller is configured to apply the control signal to the plurality of gas ejectors to increase the flow rate of the inert gas ejected through the ejection nozzles immersed in the liquid chemical in such a manner that the total flow rate of the inert gas ejected through the ejection nozzles immersed in the liquid chemical is constantly maintained.

10. The liquid chemical tank module of claim 7, wherein the controller is configured to apply the control signal to the plurality of gas ejectors in such a manner that the inert gas is ejected equally at a first flow rate through the ejection nozzles dipped in the liquid chemical and ejected equally at a second flow rate through the ejection nozzles not immersed in the liquid chemical, and wherein the first flow rate is higher than the second flow rate.

11. The liquid chemical tank module of claim 1, wherein the plurality of ejection nozzles are provided perpendicularly to the gas pipe based on the extension direction of the gas pipe to eject the inert gas in a direction parallel to a surface of the liquid chemical stored in the storage space of the tank body.

12. The liquid chemical tank module of claim 1, wherein the plurality of ejection nozzles are tilted upward at a predetermined angle to the gas pipe based on the extension direction of the gas pipe to eject the inert gas diagonally toward a surface of the liquid chemical stored in the storage space of the tank body.

13. The liquid chemical tank module of claim 12, wherein the plurality of ejection nozzles are tilted upward at the predetermined angle of 40° to 50° with respect to the gas pipe.

14. A liquid chemical supply apparatus comprising:
a first liquid chemical tank configured to supply a liquid chemical to a substrate processing apparatus for processing a substrate; and
a second liquid chemical tank connected to the first liquid chemical tank through at least one circulation line and configured to circulate the liquid chemical to the first liquid chemical tank and control the liquid chemical to a target temperature suitable for process conditions,
wherein each of the first and second liquid chemical tanks comprises:
a tank body having a storage space capable of storing the liquid chemical;
a gas ejector configured to eject an inert gas into the liquid chemical stored in the storage space to reduce dissolved oxygen in the liquid chemical stored in the storage space of the tank body; and
a controller configured to apply a control signal to the gas ejector to control a flow rate of the inert gas ejected through the gas ejector, and
wherein the gas ejector comprises:
a gas pipe extending into the storage space through a surface of the tank body in a height direction of the tank body and at least partially immersed in the liquid chemical stored in the storage space and configured to supply the inert gas from outside of the tank body into the storage space;
a plurality of ejection nozzles provided at predetermined intervals along an extension direction of the gas pipe and configured to eject the inert gas into the storage space or the liquid chemical stored in the storage space; and
a plurality of level sensors corresponding to the number of the plurality of ejection nozzles, mounted on the gas pipe, and positioned individually adjacent to the plurality of ejection nozzles to sense the liquid chemical.

15. The liquid chemical supply apparatus of claim 14, wherein the circulation line comprises:
an inner circulation line configured to circulate the liquid chemical of the first and second liquid chemical tanks and control the liquid chemical to the target temperature while the liquid chemical is being circulated; and
an outer circulation line configured to supply the liquid chemical stored in the first liquid chemical tank to the substrate processing apparatus and recirculate the remaining liquid chemical not supplied to the substrate processing apparatus to the first and second liquid chemical tanks.

16. A liquid chemical tank module comprising:
a tank body having a storage space capable of storing a liquid chemical;

a plurality of gas ejectors mounted in the tank body and configured to eject an inert gas into the liquid chemical stored in the storage space to reduce dissolved oxygen in the liquid chemical stored in the storage space of the tank body;

a sensor configured to sense a level of the liquid chemical stored in the storage space of the tank body; and a controller configured to apply a control signal to the gas ejectors to control a flow rate of the inert gas ejected through the gas ejectors, based on level information of the liquid chemical received from the sensor, wherein the gas ejectors comprise:

a first gas ejector mounted at a side of the tank body and configured to eject the inert gas into the storage space or the liquid chemical stored in the storage space; and a second gas ejector mounted at another side of the tank body to face the first gas ejector and configured to eject the inert gas into the storage space or the liquid chemical stored in the storage space, wherein the sensor comprises a plurality of level sensors corresponding to the number of a plurality of ejection nozzles, mounted on a gas pipe, and positioned individually adjacent to the plurality of ejection nozzles to sense the liquid chemical, wherein the plurality of ejection nozzles comprise:

a first ejection nozzle provided on the gas pipe at a predetermined height from a bottom surface of the storage space so as to be positioned at a height adjacent to the bottom surface;

a second ejection nozzle provided above the first ejection nozzle on the gas pipe so as to be spaced apart from the first ejection nozzle by a first interval; and an nth ejection nozzle provided above an (n−1)th ejection nozzle on the gas pipe so as to be spaced apart from the (n−1)th ejection nozzle by the first interval, wherein the plurality of level sensors comprise:

a first level sensor mounted above the first ejection nozzle on the gas pipe so as to be adjacent to and spaced apart from the first ejection nozzle by a second interval less than the first interval;

a second level sensor mounted above the second ejection nozzle on the gas pipe so as to be adjacent to and spaced apart from the second ejection nozzle by the second interval; and an nth level sensor mounted above the nth ejection nozzle on the gas pipe so as to be adjacent to and spaced apart from the nth ejection nozzle by the second interval, and wherein the controller is configured to receive the level information of the liquid chemical from the sensor and apply the control signal to the gas ejectors in such a manner that a flow rate of the inert gas ejected through ejection nozzles immersed in the liquid chemical from among the plurality of ejection nozzles is higher than a flow rate of the inert gas ejected through ejection nozzles not immersed in the liquid chemical, and to feedback-control the flow rate of the inert gas ejected through the ejection nozzles immersed in the liquid chemical based on the level information of the liquid chemical in such a manner that a total flow rate of the inert gas ejected through the ejection nozzles immersed in the liquid chemical is constantly maintained regardless of a change in the number of ejection nozzles immersed in the liquid chemical based on a change in the level of the liquid chemical.

* * * * *